(12) United States Patent
Nakamura et al.

(10) Patent No.: US 7,615,849 B2
(45) Date of Patent: Nov. 10, 2009

(54) SEMICONDUCTOR DEVICE AND MANUFACTURING METHOD THEREOF

(75) Inventors: Shun-Ichi Nakamura, Nagano (JP);
Yoshiyuki Yonezawa, Nagano (JP);
Hiroyuki Fujisawa, Nagano (JP);
Takashi Tsuji, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 258 days.

(21) Appl. No.: 11/530,850

(22) Filed: Sep. 11, 2006

(65) Prior Publication Data

US 2007/0057262 A1 Mar. 15, 2007

(30) Foreign Application Priority Data

Sep. 12, 2005 (JP) ............... 2005-264278

(51) Int. Cl.
*H01L 29/04* (2006.01)
*H01L 29/06* (2006.01)

(52) U.S. Cl. ............... 257/628; 257/627; 257/521; 257/527; 257/E31.04; 257/E31.049; 438/700; 438/701; 438/931

(58) Field of Classification Search ............... 257/627, 257/628, 521, 527; 438/700, 931
See application file for complete search history.

(56) References Cited

U.S. PATENT DOCUMENTS 5,744,826 A * 4/1998 Takeuchi et al. ............... 257/77
6,057,558 A 5/2000 Yamamoto et al.
2004/0051136 A1 * 3/2004 Kataoka et al. ............... 257/328
2008/0153216 A1 * 6/2008 Kumar et al. ............... 438/173

FOREIGN PATENT DOCUMENTS

| JP | 09-199724 A | 7/1997 |
| JP | 10-247732 A | 9/1998 |
| JP | 10-308511 A | 11/1998 |

(Continued)

OTHER PUBLICATIONS

Y. Kanzaki et al., High Channel Mobilities of MOSFETs On Highly-doped 4H-SiC (11-20) Face By Oxidation in N2O Ambient, Materials Science Forum, 2004, pp. 1429-1432, vols. 457-460, Trans Tech Publications, Switzerland.

(Continued)

*Primary Examiner*—Dao H Nguyen
(74) *Attorney, Agent, or Firm*—Rossi, Kimms & McDowell LLP

(57) ABSTRACT

In a semiconductor device having SiC vertical trench MOSFETs, it is aimed to prevent the generation of large scattering in the channel resistance without largely increasing the average value of channel resistance. A 4H-SiC substrate having a major face thereof that is generally a {0001} face and having an off angle α. The trench is formed with the standard deviation σ in scattering of the angle formed by a trench side wall face and a substrate major face within a wafer face. By setting the designed value of the angle formed by the trench side wall face and the substrate major face at an any angle ranging from [(60 degrees)+2σ] to [(90 degrees)−tan$^{-1}$ (0.87×tan α)−2σ] in forming the trench in the SiC substrate, a semiconductor device in which the angle formed by the trench side wall face and the substrate major face is 60 degrees or more but not more than [(90 degrees)−tan$^{-1}$ (0.87×tan α)] can be obtained.

20 Claims, 6 Drawing Sheets

FOREIGN PATENT DOCUMENTS

| | | |
|---|---|---|
| JP | 10-308512 A | 11/1998 |
| JP | 11-251592 A | 9/1999 |
| JP | 2002-261275 A | 9/2002 |
| JP | 3-610721 B2 | 10/2004 |

OTHER PUBLICATIONS

Rohm Co.,Ltd; "http://www.rohm.co.jp/news/sicpower-g.html," accessed on Dec. 2004; pp. 1-3; (C) 1997-2005 Rohm.

* cited by examiner

SEMICONDUCTOR DEVICE AND MANUFACTURING METHOD THEREOF

BACKGROUND

There is a possibility that the on-resistance can be largely reduced by preparing a high withstand voltage power device using SiC as a semiconductor material. For example, according to a press release by Rohm Co., Ltd., the on-resistance of SiC MOSFETs that Rohm plans to mass-produce can be half the on-resistance of silicon IGBTs with the same withstand voltage class. See Development of low-loss SiC power MOSFET of 1/40 of the conventional one!, at http://www.rohm.co.jp/news/sicpower-j.html. MOSFETs with high withstand voltage containing SiC as the major material are expected to be marketed from semiconductor manufacturers within the next two years. If the cost reduction and improvements in electrical characteristics are achievable, it is thought that the greater part of Si IGBTs in an inverter part will be substituted with SiC IGBTs.

SiC can largely reduce the on-resistance because it has a high insulation breakdown field, even when its drift layer is thinner than an Si device. Thus, it is possible to realize the same withstand voltage as that in the Si device. Moreover, since the doping concentration of the drift layer can be increased, it is possible to reduce the resistance of the drift layer by double digits or more as compared with Si. It is known that the insulation breakdown field of SiC has strong anisotropy. Thus, it is considered that the insulation breakdown field in a <0001> direction is high. Accordingly, in a device wherein a voltage is applied in a direction vertical to a major face of a substrate, namely a depth direction of the device, the major face having a {0001} face is preferable because the insulation breakdown field is high and the resistance of the drift layer can be reduced.

In Si high withstand voltage devices, the resistance of the drift layer accounts for the greater part of the on-resistance. In contrast, with respect to the on-resistance of SiC devices, as described previously, the resistance of the drift layer is reduced so that the influence of the resistance of MOS channels becomes relatively large. In particular, since the state of an $SiO_2$/SiC interface as good as compared with that of an $SiO_2$/Si interface, the MOS channel mobility on the $SiO_2$/SiC interface is approximately one digit smaller than that of the $SiO_2$/Si interface. Accordingly, in SiC high withstand voltage devices, it is important to reduce the on-resistance caused by the MOS channels.

The MOS channel resistance is in proportion to the channel length and in inverse proportion to the channel mobility. Accordingly, to reduce the MOS channel resistance, it is important to select the face azimuth or the formation condition of a gate oxide film so as to obtain high channel mobility and to shorten the channel length. For the sake of reducing the MOS channel resistance, a device structure in which a number of channels are integrated in the same area is preferable. Such a device structure includes a trench MOS structure. According to the trench MOS structure, a number of channels can be integrated without generating parasitic resistance, such as a JFET effect.

FIG. 8 is a cross-sectional view showing the configuration of a general vertical trench MOSFET. As illustrated in FIG. 8, an n-type withstand voltage layer 2 is stacked on one of the major faces of an n-type SiC substrate 1, and a p-type body layer 3 is further stacked thereon. An n-type source contact region 4 and a p-type body contact region 5 adjacent thereto are provided on the p-type body layer 3. A trench 6 penetrates through the n-type source contact region 4 and the p-type body layer 3 and reaches the n-type withstand voltage layer 2. A side wall face and a bottom face of the trench 6 are covered with a gate oxide film 7. A gate electrode 8 is embedded inside the gate oxide film 7 within the trench 6. An upper side of the gate electrode 8 is covered with an interlayer insulation film 9. A source electrode 10 comes into ohmic contact with both the n-type source contact region 4 and the p-type body contact region 5. A drain electrode 11 comes into ohmic contact with the other major face of the n-type SiC substrate 1.

Now, if the doping concentration of a drift layer (n-type withstand voltage layer 2) is increased, a depletion layer is liable to be elongated even in the body region (p-type body layer 3) coming into contact with the drift layer when applying a reverse voltage. To avoid the occurrence of a phenomenon where the body region becomes a so-called punch-through state of being completely depleted, it is required to increase the doping concentration of the body region or to thicken the body region. It is known, however, that increasing the doping concentration of the body region decreases the channel mobility of MOS channels as formed in the body region, as is disclosed in Japanese Patent No. 3610721, which is a counterpart of U.S. Pat. No. 6,057,558. For that reason, there remains an upper limit in the doping concentration of the body region, making it impossible to increase the doping concentration of the body region exceeding that upper limit. Also, where the trench side wall face is vertical to the major face of the substrate, the channel length of a trench MOSFET is equal to the thickness of the body region. Since the thickness of the body region is determined by the desired withstand voltage, it is impossible to shorten the channel length of a trench MOSFET.

The aforementioned patents disclose that when the trench side wall face on which MOS channels are formed is a flat face, a high channel mobility is obtained. However, when the trench side wall face is not vertical to the major face of the substrate (i.e., inclined), the channel length of a MOSFET along the trench side wall face becomes longer than the thickness of the body region. Accordingly, even if the channel mobility is high, the channel resistance cannot be always reduced.

For example, for the purpose of increasing the channel mobility of a MOS device, it has been proposed to form a gate oxide film and a gate electrode on a (03-38) face, as disclosed in JP-A-2002-261275. The (03-38) face is a face that is angled by 54.7 degrees from a (0001) face. Accordingly, when the (0001) face is the major face and the trench side wall face is the (03-38) face, the trench side wall face becomes inclined at an angle of 54.7 degrees from the major face. In this case, the channel length is approximately 1.2 times the thickness of the body region because it becomes "1/(sin 54.7°)" of the thickness of the body region. In contrast, when the trench side wall face is vertical to the (0001) face, the channel length becomes equal to the thickness of the body region. In other words, if the channel mobility on the (03-38) face cannot be increased by at least 20% as compared with that on the vertical face to the (0001) face, even when the trench side wall face is the (03-38) face. Thus, the channel resistance cannot be reduced.

Also, for the sake of reducing the on-resistance, not only the channel resistance but also the degree of integration of channels is important. In a device such as trench MOSFETs, a specific structure is repeatedly integrated. Accordingly, the smaller the dimensions of the unit structure, the smaller the dimensions (cell pitch) of the unit structure into a repeating direction are. Thus, the degree of integration is improved, and the on-resistance becomes low.

FIGS. 9 and 10 each schematically show a cross-section shape of a trench. As is clear from the comparison of the both drawings, if the width of the trench bottom is identical, an opening width W1 of a trench 23, where a trench side wall face 21 is not vertical to a major face 22 of a substrate, is wider than an opening width W2 of a trench 25 when a trench side wall face 24 is vertical to the major face 22. Accordingly, when the trench side wall face 24 is inclined, the cell pitch becomes large. This will be concretely considered below while the foregoing (03-38) face is a trench side wall face as an example.

For simplicity, in FIG. 8, a so-called stripe-cell structure where the structure in the depth direction on the drawing does not change will be considered. Taking into consideration the thickness of the n-type source contact region 4, the thickness of the p-type body layer 3 and the preparation margin, the trench 6 is set have a depth of 3 μm. It is thought that a depth of 3 μm is a standard value in trench MOSFETs using SiC. Furthermore, as illustrated in FIG. 10, when the trench side wall face 24 is vertical to the major face 22, the cell pitch is set at 14 μm. When the mask alignment margin and the exposure boundary are supposed to be 2 μm, respectively, which is the minimum cell pitch that can be realized (as assumed by the present inventors). In such supposition, as illustrated in FIG. 9, when the trench side wall face 21 is the (03-38) face, the cell pitch is 18 μm, a value of that is increased by about 28% as compared with that in the case of FIG. 10.

Accordingly, when the trench side wall face is the (03-38) face, the on-resistance caused by the channel resistance is increased by 55% while increasing the cell pitch and the channel length. When the mask alignment margin and the exposure boundary are improved to 1 μm, a rate of increase of the on-resistance caused by the channel resistance reaches 90%. This is not limited to the stripe-cell structure but also is applicable to other structures, such as a hexagonal cell structure.

The aforementioned JP-A-2002-261275 discloses that the channel mobility on the (03-38) face is 86 cm²/Vs. On the other hand, it is reported that when the trench side wall face is a face vertical to the (0001) face, for example a (11-20) face, the channel mobility becomes approximately 65 cm²/Vs, as disclosed in Y. KANZAKI, et al, High channel mobilities of MOSFETs on highly-doped 4H-SiC (11-20) face by oxidation in N₂O ambient, Materials Science Forum 2004, pages 1429 to 1432. It is noted from these values that in a trench MOSFET as designed in minimum dimensions when the mask alignment margin and the exposure boundary are 1 μm, respectively, the channel resistance when using the (03-38) face as the trench side wall face is approximately 40% higher than that when using the (11-20) face. Accordingly, when using the (11-20) face as the trench side wall face, the on-resistance becomes lower. Even if a face with high channel mobility is selected, low channel resistance cannot be always realized so that a structural factor of device must be taken into consideration.

In forming a trench in SiC, a plasma etching method is usually employed. Furthermore, under the existing circumstances, since it is difficult to prepare a lowly doped layer of SiC suitable as a drift layer with good reproducibility on an industrial scale by bulk growth, the drift layer is prepared by an epitaxial growth technique. Incidentally, in expressing Miller indices, "–" means a bar attached to an index just thereafter, and by attaching "–" before the index, it is meant that the index is a negative index.

According to the related-art technologies, however, in forming a trench by a plasma etching method, it is extremely difficult to uniformly keep the plasma conditions within a wafer face. For that reason, an angle of the trench side wall face against the major face (hereinafter referred to as "trench angle") is scattered within the wafer face. Scattering the trench angle undesirably scatters the channel resistance, which scatters the on-resistance, leading to hindrance of practical implementation.

Also, to epitaxially growing an SiC layer with a suitable quality as a drift layer on a {0001} face of SiC, a large off angle is required. For example, 4H-SiC has large electron mobility and is highly expected as a semiconductor material for electric power. To epitaxially grow a high-quality SiC layer with good reproducibility on an industrial scale on a {0001} face of 4H-SiC, it is considered that an off angle of from 4 to 8 degrees is required, which not only scatters the trench angle within the foregoing wafer face, but also fluctuates the face azimuth of the trench side wall face.

For example, in FIGS. 9 and 10, if an off direction of the substrate is a right direction on the drawing, the face azimuth of the trench side wall face in the left side is shifted into a positive direction corresponding to the off angle. On the other hand, the face azimuth of the trench side wall face in the right side is shifted into a negative direction corresponding to the off angle. In other words, where the off angle is 8 degrees, the face azimuth differs by 16 degrees between the trench in the left side and the trench in the right side.

Accordingly, there remains a need to put an SiC-made trench MOSFET into practice by reducing the channel resistance among a considerably wide trench angle range. The present invention addresses this need.

SUMMARY OF THE INVENTION

The present invention relates to a semiconductor device such as a vertical trench MOSFET (insulation gate type field effect transistor having a metal-oxide-semiconductor structure) using SiC (silicon carbide) as a semiconductor material and to a manufacturing method thereof.

One aspect of the present invention is a semiconductor device that can include at least one SiC semiconductor layer having an azimuth of a major face thereof that is generally a {0001} face and having an off angle $\alpha$, and at least one trench in the semiconductor layer having side walls, with normal lines of faces of the side walls generally in a <1-100> direction when projected on the major face of the semiconductor layer. An angle formed by the side wall faces of the trench and the major face of the semiconductor layer is 60 degrees or more but not more than $[(90 \text{ degrees}) - \tan^{-1}(0.87 \times \tan \alpha)]$.

A plurality of unit structures including the trench can be repeatedly formed at a predetermined pitch, which is not more than two times a repeating pitch of the unit structure where the side wall faces of the trench would form an angle of 90 degrees against the major face of the SiC semiconductor layer. The azimuths of the trench side wall faces can be off from any of the {1-100} face family of SiC into the <0001> direction. The off direction of the major face of the SiC semiconductor layer is generally in a <11-20> direction. The side wall faces of the trench are not parallel to the off direction of the major face of the SiC semiconductor layer.

Another aspect of the present invention is a method of manufacturing the semiconductor device. The method can include providing the SiC semiconductor layer having an azimuth of a major face thereof that is generally a {0001} face and having an off angle $\alpha$, forming the trench in the semiconductor having side walls, with normal lines of faces of the side walls extending generally in a <1-100> direction when projected on the major face of the semiconductor layer, with an angle formed by the side wall faces of the trench and the major face of the semiconductor layer being 60 degrees or more but not more than $[(90 \text{ degrees}) - \tan^{-1}(0.87 \times \tan \alpha)]$.

The trench forming step can include setting a design value of the angle formed by the trench side wall faces and the major face of the semiconductor layer at any angle within the range from (60 degrees+2σ) to [(90 degrees)−tan$^{-1}$ (0.87×tan α)−2σ], where σ represents a standard deviation of scattering in the angle formed by the trench side wall faces and the major face of an SiC semiconductor layer within a wafer face of a wafer forming the semiconductor layer. The method can further include accumulating polysilicon on the trench side wall faces, and thermally oxidizing the polysilicon to form a gate oxide film.

The term "generally" has been referred to above because it is difficult to precisely cut out SiC into a prescribed azimuth, and the substrates with the off angle are marketed for the purpose of obtaining good epitaxial growth on an SiC substrate. With respect to the {0001} face of currently marketed 4H-SiC, lots of specifications having an off angle of (8±0.5 degrees) or (4±0.5 degrees) in a direction of (<11-20>±15 degrees) exist. Accordingly, the term "generally" as referred above should be interpreted to include at least a range within 10 degrees from the {0001} face in the face azimuth and a range within 15 degrees from the {1-100} direction.

The term "family" as referred to herein collectively expresses crystallographically equivalent faces or azimuths.

DETAILED DESCRIPTION

Preferred embodiments of the semiconductor device and the manufacturing method thereof according to the invention will be described in detail with reference to the accompanying drawings. Layers or regions prefixed with "n" or "p" means that majority carriers are electrons or holes, respectively. Also, the suffix "+" following "n" or "p" means that the concentration of impurities is relatively high.

The present inventors have found that when a trench side wall face is inclined from a {1-100} face of a 4H-SiC substrate into a <0001> direction, the rate of change in the channel mobility due to the incline of the trench side wall faces can be smaller as compared with the case where the trench side wall faces are inclined from a {11-20} face thereof into a <0001> direction.

First, Preliminary Experiments 1 and 2 conducted by the present inventors will be described. Preliminary Experiment 1 is an experiment for examining the channel mobility when the trench side wall face is inclined from a (1-100) face of a 4H-SiC substrate or layer into a <0001> direction. Preliminary Experiment 2 is an experiment for examining the channel mobility when the trench side wall face is inclined from a (11-20) face of a 4H-SiC substrate or layer into a <0001> direction.

Figure 1:
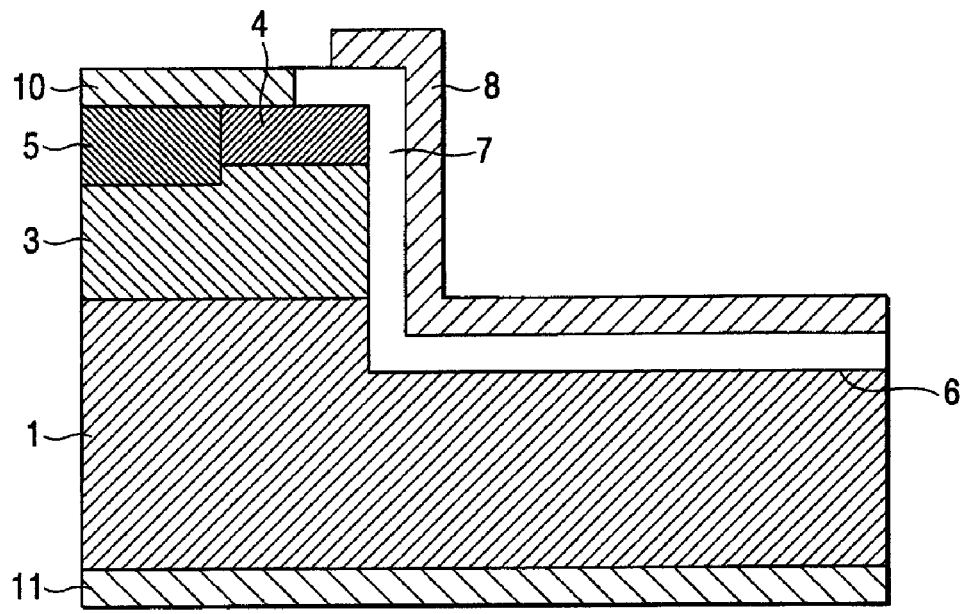
FIG. 1 is a cross-sectional view showing the configuration of a device used in preliminary experiments.
Figure 8:
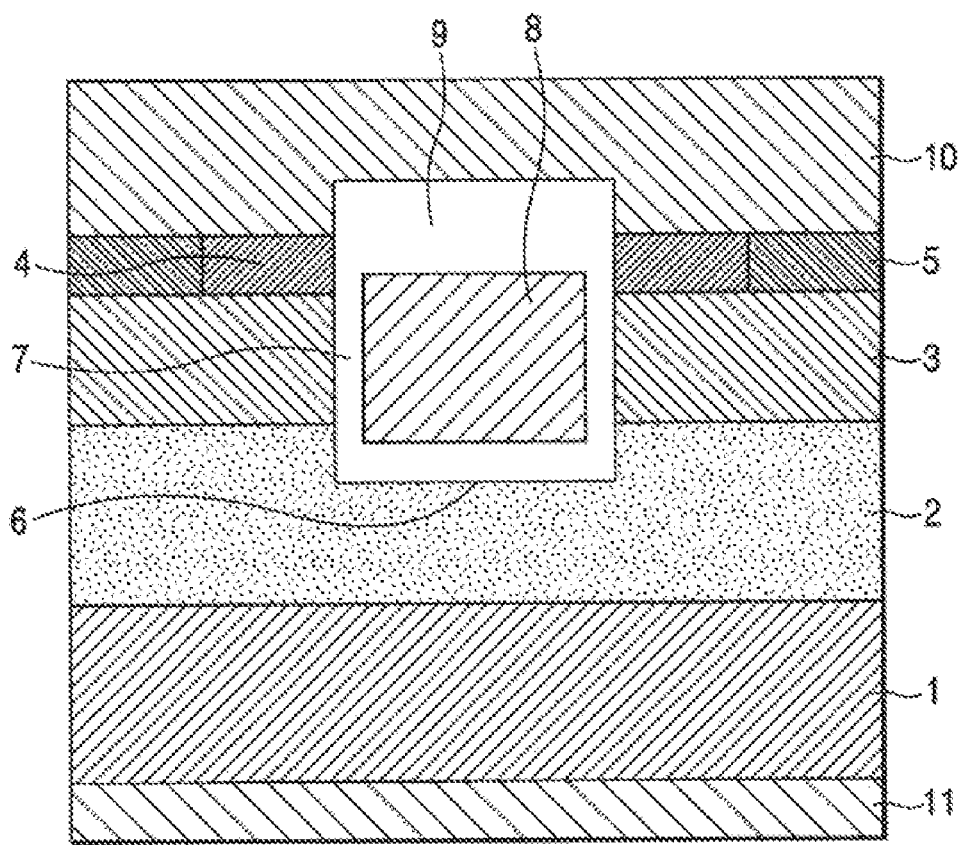
FIG. 8 is a cross-sectional view showing the configuration of a general vertical trench MOSFET.
Figure 9:
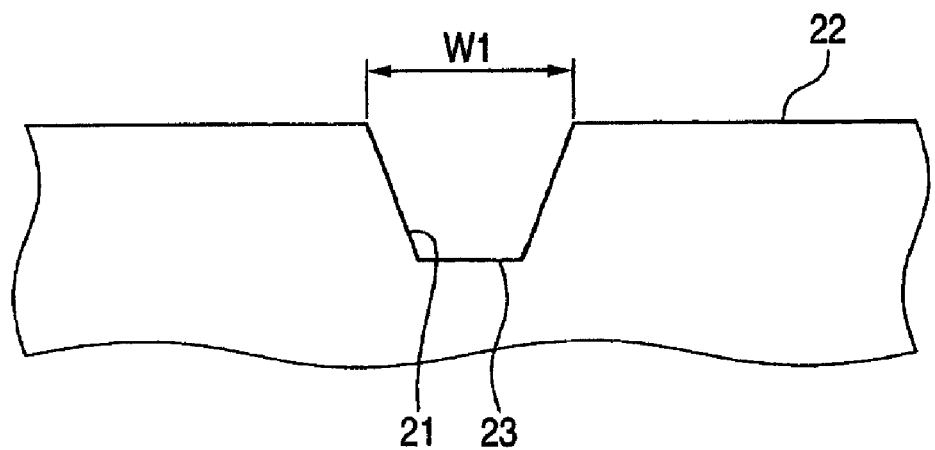
FIG. 9 is a view showing a cross-sectional shape of a trench.
Figure 10:
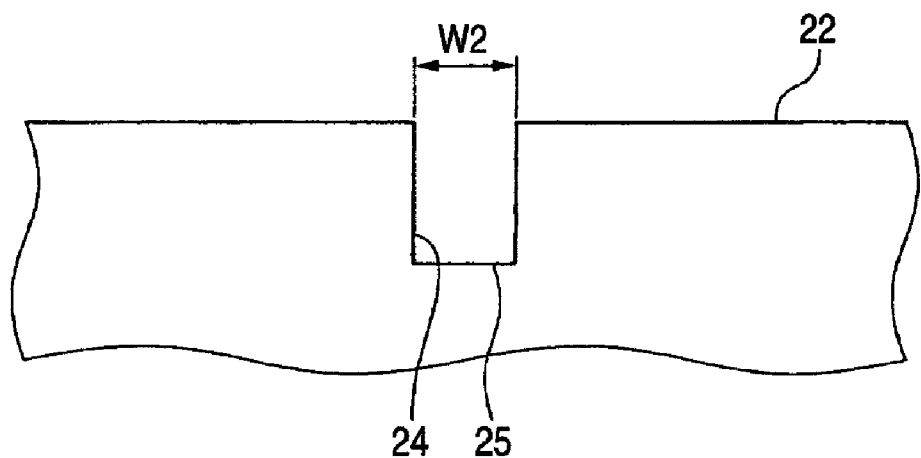
FIG. 10 is a view showing a cross-sectional shape of a trench.

FIG. 1 is a cross-sectional view showing the configuration of a device used in Preliminary Experiments 1 and 2. The device illustrated in FIG. 1 is one resulting from simplifying the trench MOSFET illustrated in FIG. 8, with its gate structure formed only on one side of the trench. The n-type withstand voltage layer 2, however, is omitted in FIG. 1. In the device illustrated in FIG. 1, the same elements are referred using the same references as used as in FIG. 8, and duplicate explanations thereof are omitted.

In Preliminary Experiment 1, an SiC substrate 1 with a (11-20) just face as the major face was used. In this substrate 1, a trench 6 having a trench side wall face with a different face azimuth was formed such that a direction projecting a normal line of the trench side wall face on a (11-20) face becomes a direction inclined by every 10 degrees from <0001>. Then, the channel mobility in a reverse MOS channel formed on the trench side wall was determined.

Next, preparation procedures of the device as illustrated in FIG. 1 will be described. First, an n$^+$-type 4H-SiC substrate 1 with a (11-20) just face (with the donor concentration of 1×10$^{18}$ cm$^{-3}$ or more) as the major face was prepared. On one major face of this n$^+$-type 4H-SiC substrate 1 (hereinafter referred to as a "front face"), a p-type body layer 3 (with the acceptor concentration of about 2×10$^{17}$ cm$^{-3}$) was epitaxially grown to a thickness of about 2 μm, and an n$^+$-type semiconductor layer (with the donor concentration of 1×10$^{18}$ cm$^{-3}$ or more), which becomes an n$^+$-type source contact region 4, was subsequently epitaxially grown to a thickness of about 0.3 μm.

Next, thermal oxidation was carried out in a wet atmosphere at 1,200° C. for 30 minutes to form a screen oxide film, and a desired mask pattern was then formed using a photoresist layer. Subsequently, ion implantation with Al was carried out at room temperature so as to have a box profile having an average density of 5×10$^{19}$ cm$^{-3}$ to a depth of 0.35 μm from the surface of the n$^+$-type epitaxially grown layer.

After removing the mask of the photoresist layer and the screen oxide film, a photoresist layer was again coated on its exposed face and thereafter carbonized with heat at about 800° C. in an Ar atmosphere, thereby forming a carbon cap. The injected Al was activated by keeping the stack in this state in an Ar atmosphere at about 1,800° C. for 30 minutes, thereby forming a p-type body contact region 5. Thereafter, the stack was kept in an O$_2$ atmosphere at about 800° C. for one hour, thereby removing the carbon cap.

Next, an Al film was formed by sputtering, and a photolithography step and a wet etching step were carried out to achieve a desired pattern (patterning), thereby forming an Al mask for plasma etching. Anisotropic etching was carried out by inductive coupling (ICP) plasma etching with, as reacting gases, SF$_6$ and O$_2$, thereby forming a trench 6. With respect to part of samples among a group of the thus obtained samples, cross-sectional observation was carried out by using a scanning electron microscope, which revealed that the trench angle was 80 degrees or more, and the majority of the observed samples had a trench angle of 85 degrees or more.

After removing the Al mask, polysilicon was accumulated to a thickness of about 50 nm at 520° C. This polysilicon was completely thermally oxidized in a wet atmosphere at 1,200° C. This thermally oxidized film was annealed in an $N_2O$ atmosphere (diluted with 10% $N_2$) at 1,250° C. for one hour, thereby forming a gate oxide film 7. Incidentally, with respect to part of samples, sacrificial oxidation was carried out in a wet atmosphere at 1,200° C. for 30 minutes prior to accumulating polysilicon, thereby removing the formed sacrificial oxide film.

Next, the front face was covered with a photoresist layer and dipped in buffered hydrofluoric acid, thereby removing the oxide film on the other major face of the $n^+$-type 4H-SiC substrate 1 (hereinafter referred to as a "rear face"). Then, a Ni film was formed on the rear face by sputtering. Subsequently, the photoresist on the front face was removed, and a mask for forming a source contact hole was formed by photolithography. Then, a source contact hole was formed on the thermally oxidized film using buffered hydrofluoric acid. Thereafter, a Ni film was formed on each of the exposed faces of the $n^+$-type source contact region 4 and the p-type body contact region 5 on the front face by sputtering. After patterning, annealing was carried out in an Ar atmosphere at 1,000° C. for 30 minutes, thereby forming a source electrode 10 and a drain electrode 11.

Next, an Al film was formed within the trench 6 by sputtering, followed by patterning to form a gate electrode 8. In the foregoing manufacturing process, steps other than the activation step of Al having been subjected to ion implantation during formation of the p-type body contact region 5 and the step relating to the formation of the gate oxide film 7 are not specific to Si or SiC device formation. Furthermore, since the steps other than the step relating to the formation of the gate oxide film 7 are not relevant to the understanding of the present invention, detailed explanations thereof have been omitted.

Figure 2:
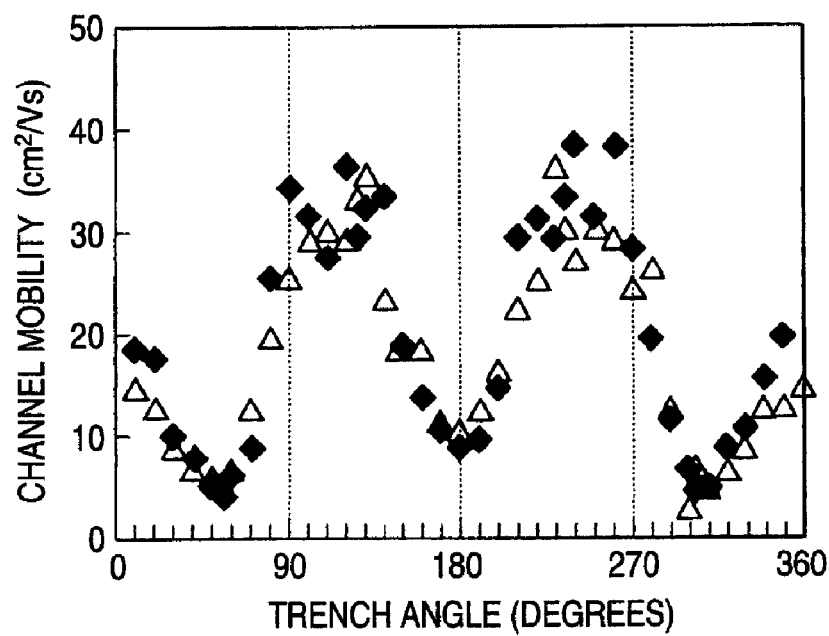
FIG. 2 is a characteristic graph showing the result of Preliminary Experiment 1.

With respect to a number of MOSFETs prepared by the foregoing process, the result obtained by examining the channel mobility is shown in FIG. 2. In FIG. 2, the abscissa represents the trench angle, and the ordinate represents the channel mobility. The "off direction" as referred to herein means an angle formed by a direction projecting a normal line of the trench side wall face on a (11-20) face, which is the major face, and a <0001> direction.

As is clear from FIG. 2, in the samples having been subject to sacrificial oxidation, the channel mobility is substantially constant from 30 to 40 $cm^2$/Vs over a wide range of the trench angle from 90 to 140 degrees from the $(0001)_{si}$ face and its crystallographically equivalent range from 270 to 220 degrees. The reason why the channel mobility slightly fluctuates within this range is believed to reside in scattering of the contact resistance caused by incompleteness of the source and drain formation steps. This, however, is not believed to a substantial phenomenon. From this result, even when the trench side wall face is inclined over a wide range as from 0 to 50 degrees from the (1-100) face, the channel mobility is believed to not substantially change.

With respect to Preliminary Experiment 2, where the trench side wall face is inclined from the (11-20) face of 4H-SiC into the <0001> direction, it is impossible to directly examine the channel mobility, not like Preliminary Experiment 1. This is because for the purpose of directly examining the channel mobility, although a substrate in which the (1-100) face is the major face must be used, it is extremely difficult to achieve epitaxial growth against the (1-100) face of a 4H-SiC substrate so that an epitaxially grown layer suitable for preparing and evaluating a device is not obtained.

Then the following experiment was carried out. A device having the same structure as that illustrated in FIG. 1 was prepared using an n-type SiC substrate in which $(000-1)_c$ is the major face. The trench 6 was formed such that the direction facing to the right or facing to the left in FIG. 1 was in a [11-20] off direction. The off angle of the substrate 1 is 8 degrees. Preparation procedures of the device were the same as in Preliminary Experiment 1. Cross-sectional observation of the thus obtained device was carried out using a scanning electron microscope, which revealed a trench angle of about 80 degrees.

With respect to MOSFETs prepared for Preliminary Experiment 2, the channel mobility was examined. Where the off direction was a direction facing to the right in FIG. 1, the channel mobility was approximately 40 $cm^2$/Vs, whereas when the off direction was a direction facing to the left, the channel mobility was approximately 20 $cm^2$/Vs. It is noted from the relation between the trench angle and the off angle that when the off direction is a direction facing to the right in FIG. 1, the trench side wall face is off by about 2 degrees from the (11-20) face into the <0001> direction, whereas when the off direction is a direction facing to the left, the trench side wall face is off by about 18 degrees in a similar fashion. The same is also reported in Hiroshi NAKANO, et al, Evaluation of characteristics of 4H-SiC MOSFETs formed on trench side wall, Extended Abstracts (The 52nd Meeting, 2005), The Japan Society of Applied Physics and Related Societies, 1p-YK-2, page 457, 2005.

According to Preliminary Experiment 2, it was noted that the channel mobility became half before separating by 20 degrees at least from the (11-20) face. It was understood from this that even when a device is designed such that it is not geometrically affected by the off angle, the channel mobility varies due to the influence of processing errors, and the channel resistance is largely changed thereby so that the device is not suitable for practical use. Incidentally, as mentioned in Embodiments 1 to 3 described later, scattering in the trench angle by several degrees or more is generated even within the same wafer face.

It is noted from the results of Preliminary Experiments 1 and 2 that when a gate oxide film is formed by the method employed in Preliminary Experiments 1 and 2, the case of inclining the trench side wall face from the (1-100) face of a 4H-SiC substrate into the <0001> direction is preferable as compared with the case of inclining the trench side wall face from the (11-20) face thereof into the <0001> direction. This is because the changes in the channel mobility due to the inclination are small. Although how the bonding comes out from respective atoms constituting SiC varies depending upon the face azimuth, it is believed that such a difference in the changes in the channel mobility due to the inclination relating to the behavior of those changes is different between the case of inclining from the {1-100} face and the case of inclining from the {11-20} face. Accordingly, even when employing many gate oxide film formation methods not limiting to the gate oxide film formation methods in Preliminary Experiments 1 and 2, the same tendency as in the present preliminary experiments is believed to be obtained.

For example, in forming a gate oxide film, there can be employed a method in which by using a mixed gas of silane based gas and $O_2$, $N_2O$ or the like, or a single raw material such as TEOS, an oxide film is accumulated in advance by a thermal CVD (chemical vapor deposition) method or a plasma CVD method (such oxide film will be hereinafter referred to as "advance oxide film"). The advance oxide film is annealed under the same condition as annealing a thermal oxide film in Preliminary Experiments 1 and 2 (namely at 1,250° C. in an atmosphere of a mixed gas of $N_2O$ and $N_2$). Alternatively, an exposed face of SiC may be directly thermally oxidized by keeping under the same condition as annealing a thermal oxide film in Preliminary Experiments 1 and 2 for a long period without forming an advance oxide film.

Figure 3:
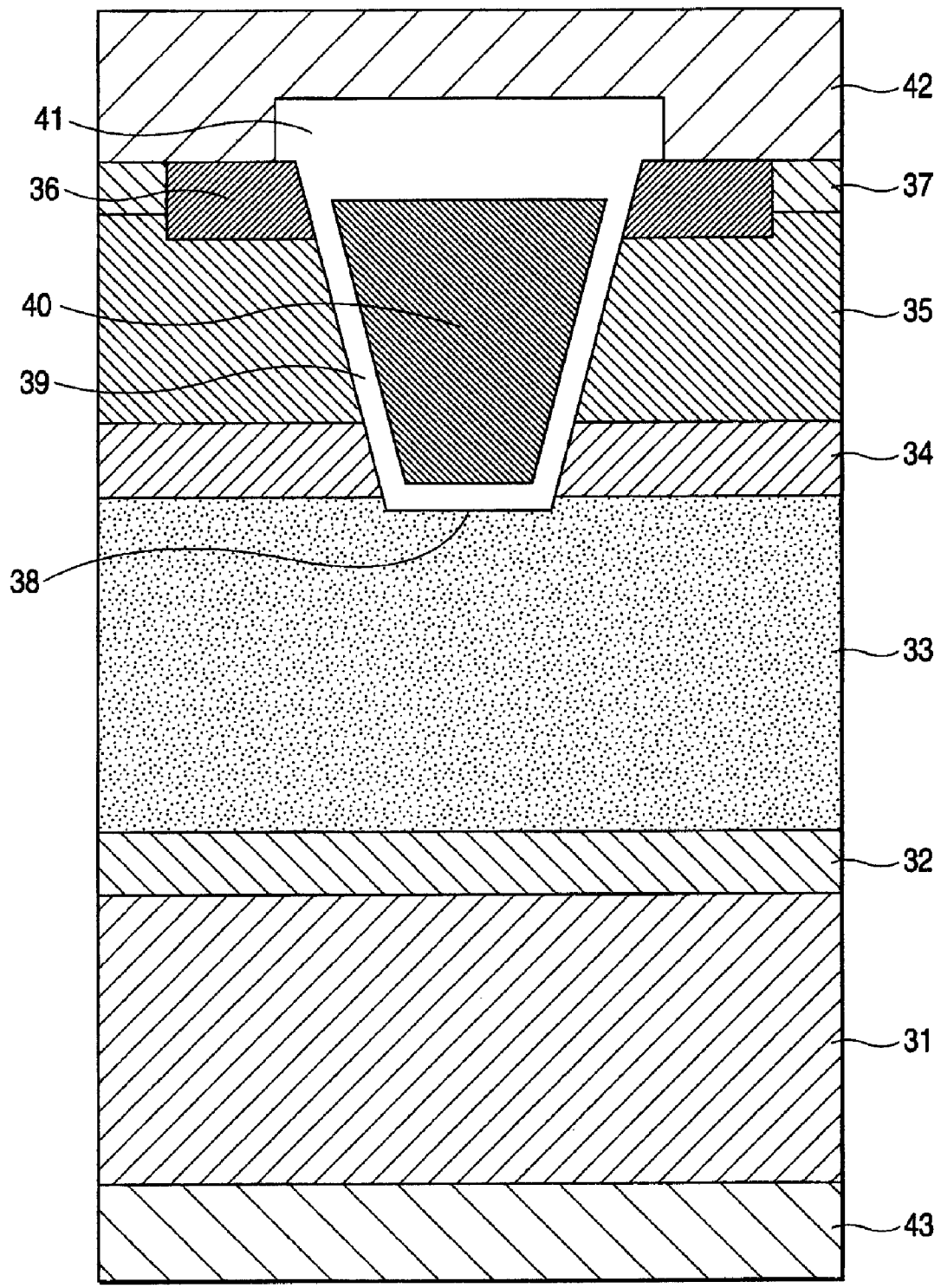
FIG. 3 is a cross-sectional view showing the configuration of a vertical trench MOSFET according to Embodiment 1.

FIG. 3 is a cross-sectional view showing the configuration of a vertical trench MOSFET according to Embodiment 1 of the invention. An n-type field stopping layer 32, an n-type withstand voltage layer 33, an n-type current spreading layer 34, and a p-type body layer 35 are successively stacked on one major face of an $n^+$-type 4H-SiC substrate 31 in which a {0001} face is the major face. An $n^+$-type source contact region 36 and a $p^+$-type body contact region 37 adjacent thereto are provided on the p-type body layer 35. A trench 38 penetrates through the $n^+$-type source contact region 36, the p-type body layer 35, and the n-type current spreading layer 34, and reaches the n-type withstand voltage layer 33. The side wall face and the bottom face of the trench 38 are covered with a gate oxide film 39. A gate electrode 40 is embedded inside the gate oxide film 39 within the trench 38. The upper side of the gate electrode 40 is covered with an interlayer insulation film 41. A source electrode 42 comes into ohmic contact with both the $n^+$-type source contact region 36 and the $p^+$-type body contact region 37. A drain electrode 43 comes into ohmic contact with the other major face of the $n^+$-type 4H-SiC substrate 31.

The n-type field stopping layer 32 and the n-type current spreading layer 34 can be omitted. When the quality of the SiC substrate 31 is insufficient, however, it is desirable to provide the n-type field stopping layer 32. This is because even when a depletion layer spreads over the entire n-type withstand voltage layer 33 at the time of applying voltage in a reverse direction, application of high field to the SiC substrate 31 in the end portion thereof can be prevented, inhibiting the occurrence of insulation breakdown of the device.

Furthermore, for the reason described below, it is desirable to provide the n-type current spreading layer 34. That is, since the n-type withstand voltage layer 33 has relatively high resistance, when the n-type current spreading layer 34 is not provided, in the on-state, current flowing on the interface between the p-type body layer 35 and the gate oxide film 39 along the side wall face of the trench 38 flows only in the vicinity of the trench 38 in the n-type withstand voltage layer 33, thereby potentially increasing the on-resistance due to current concentration. However, when the n-type current spreading layer 34 is provided, the current spreads and flows over a wide region of the n-type withstand voltage layer 33, inhibiting the increase in the on-resistance due to current concentration.

In addition, although in FIG. 3, the trench 38 penetrates through the n-type current spreading layer 34 and reaches the n-type withstand voltage layer 33, the trench 38 can be stopped at the n-type current spreading layer 34. Also, although in FIG. 3, the upper face of the gate electrode 40 is flat and located lower than the upper face of the $n^+$-type source contact region 36, the configuration is not limited thereto. For example, the upper face of the gate electrode 40 can be curved, or part or the entire upper face of the gate electrode 40 can be located higher than the upper face of the $n^+$-type source contact region 36. Nonetheless, it is desirable for the upper face of the gate electrode 40 to be located higher than the lower face of the $n^+$-type source contact region 36 and in a position as low as possible. This is because the electrostatic capacitance between a gate and a source can be reduced. Also, although in FIG. 3, the lower end of the gate electrode 40 is located between the upper face and the lower face of the n-type current spreading layer 34, the configuration is not limited thereto. It is only required that the lower end of the gate electrode 40 be located lower than a lower face of the p-type body layer 35.

Furthermore, although in FIG. 3, corners of the bottom part of each of the trench 38 and the gate electrode 40 are not rounded, they can be rounded and smoothened. Alternatively, a trench of a V-shaped groove type that does not have a flat bottom part can be employed, with the tip of the V-shaped groove sharp-pointed or rounded and smoothened. Rounded and smoothened corners are preferable as compared with sharpened corners because rounded and smoothened corners inhibit breakage of the gate insulation film caused by field crowding.

When the trench MOSFET illustrated in FIG. 3 is viewed from the upper part, it takes a so-called stripe-cell structure where the structure does not change in the face azimuth of the trench 38 and so on towards a depth direction in FIG. 3. To avoid the influence in the off angle of the substrate 31, the trench 38 is parallel to the off direction. Here, the off direction is a [11-20] direction and is a direction vertical to the drawing in FIG. 3. A lateral direction to FIG. 1 is a <1-100> direction, and the trench side wall face inclined from a {1-100} face into a <0001> direction. In this way, as considered in Preliminary Experiments 1 and 2, even when the trench angle changes within a certain range, it is possible to realize a state where the channel mobility does not largely change.

While not specifically limited, for example, the trench 38 can have a depth of 1 mm in the depth direction in FIG. 3. Furthermore, although only one trench 38 is illustrated in FIG. 3 for the purpose of keeping the disclosure simple, the actual device has a structure in which many of the same structures shown in FIG. 3 are repeatedly formed right and left in the lateral direction in FIG. 3. Its repeating period, namely the cell pitch, can be 20 μm for example. Also, the number of the trench 38 can be 50 per device, for example.

In Embodiment 1, the cell pitch is set at 20 μm for the sake of preparing devices having a different trench angle at the same time. However, in trench MOSFETs put into practical use, it is possible to decrease the cell pitch corresponding to the design of a trench angle as exemplified in Embodiment 2 or later. Also, the cell pitch can be decreased within a range where the yield is not lowered due to processing errors. The polysilicon gate electrodes 40 embedded in the trenches 38 are mutually electrically connected to the gate electrodes 40 embedded in the adjacent trenches 38 in the end part in the depth direction in FIG. 3.

Since the mutual connection structure of the gate electrodes 40 and the preparation method thereof are the same as those of the trench MOSFET of Si, explanations thereof are omitted. Furthermore, in trench MOSFETs that are put into practical use, a field relaxation structure (JTE) is usually provided in the outer periphery of a device for the purpose of improving the withstand voltage. Regardless of the configuration, or presence or absence of JTE, it is possible to make the channel resistance free from large scattering without largely increasing the average value of the channel resistance. Note that in FIG. 3, fine portions are illustrated in an exaggerated manner as compared with actual dimensions for the purpose of making it readily understandable. FIG. 3 does not depict the actual scaled dimensions, i.e., FIG. 3 is merely schematic representation.

Next, preparation procedures of the device illustrated in FIG. 3 will be described. First, two pieces of $n^+$-type 4H-SiC substrate 31 in which one surface is a $(000-1)_c$ 8-degrees off face and the other surface is a $(0001)_{si}$ 8-degrees off face (with the donor concentration of $1 \times 10^{18}$ cm$^{-3}$ or more and the off direction in the [11-20] direction) are prepared. With relation to the two n$^+$-type 4H-SiC substrate, one surface is used as a major face for one of the substrates and the other surface is used as a major face for the other substrate.

For example, an n-type field stopping layer 32 having a thickness of about 2 μm (with the donor concentration of from $0.5 \times 10^{17}$ cm$^{-3}$ to $10 \times 10^{17}$ cm$^{-3}$), an n-type withstand voltage layer 33 having a thickness of about 10 μm (with the donor concentration of about $1 \times 10^{16}$ cm$^{-3}$), an n-type current spreading layer 34 having a thickness of about 0.4 μm (with the donor concentration of about $1 \times 10^{17}$ cm$^{-3}$), and a p-type body layer 35 having a thickness of about 2 μm (with the acceptor concentration of $2 \times 10^{17}$ cm$^{-3}$) are successively epitaxially grown on the major faces of these n$^+$-type 4H-SiC substrates 31, and a p$^+$-type semiconductor layer (with the acceptor concentration of $5 \times 10^{19}$ cm$^{-3}$ or more), which becomes a p$^+$-type body contact region 37, is further epitaxially grown thereon to a thickness of about 0.3 μm.

Here, the foregoing thickness and doping concentration of each of the layers are merely exemplary, and those values are properly designed on the basis of characteristics such as withstand voltage and tolerable processing errors. Furthermore, it is not always required that all of the layers have a uniform doping concentration, and the doping concentration can change along the film formation direction.

Subsequent to the foregoing epitaxial growth of each of the layers, plasma CVD is carried out by using TEOS as source gas, thereby accumulating SiO$_2$ to a thickness of, for example, about 3.5 μm. Next, a photolithography step is carried out to form a photoresist mask pattern, and ICP plasma etching using CHF$_3$ as reacting gas is carried out to form a mask pattern of SiO$_2$. Then, the photoresist mask as well as deposit formed during the etching of SiO$_2$ are removed by O$_2$ plasma, thereby forming an SiO$_2$ mask for ion implanation. Thereafter, thermal oxidation is carried out in a wet atmosphere at 1,200° C. for 30 minutes, for example, thereby forming screen oxide films.

Next, ion implantation of phosphorus is carried out to a depth of, for example, 0.45 μm from the surface of the p$^+$-type epitaxially grown layer in a state where the sample is heated at, for example, 800° C. so as to have a box profile having an average concentration of, for example, $2 \times 10^{20}$ cm$^{-3}$. After removing the screen oxide films, a carbon cap is formed on an exposed face thereof in the same manner as in the case of Preliminary Experiment 1. The implanted phosphorus is activated in, for example, an Ar atmosphere at about 1,600° C. for 30 minutes, thereby forming n$^+$-type source contact regions 36. Thereafter, the carbon cap is removed in the same manner as in the case of Preliminary Experiment 1.

In the foregoing example, for the purpose of readily taking ohmic contact with the p$^+$-type body contact regions 37, the p$^+$-type semiconductor layer, which becomes the p$^+$-type body contact regions 37, is first epitaxially grown, and the n$^+$-type source contact regions 36 are then formed by an ion implantation method. However, the formation order of the n$^+$-type source contact regions 36 and the p$^+$-type body contact regions 37 can be exchanged. That is, after first epitaxially growing the n$^+$-type semiconductor layer, which becomes the n$^+$-type source contact regions 36, the p$^+$-type body contact regions 37 can be formed by an ion implantation method. Alternatively, both the n$^+$-type source contact regions 36 and the p$^+$-type body contact regions 37 can be formed by an ion implantation method.

Furthermore, besides SiO$_2$, any material of a mask for ion implantation can be used as long as it has heat resistance such that it is durable at the ion implantation temperature and has a required ion stopping ability. For example, thoroughly dense polysilicon and so on can be used as the material of a mask for ion implantation. Regardless of the formation order or formation method of the n$^+$-type source contact regions 36 and the p$^+$-type body contact regions 37 and the material of a mask for ion implantation, it is possible to make it free of large scattering in the channel resistance without largely increasing the average value of the channel resistance.

Figure 4:
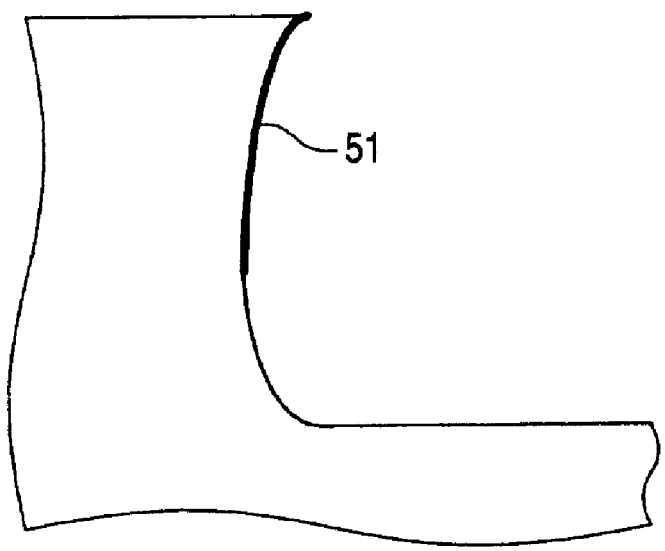
FIG. 4 is a cross-sectional view schematically showing the shape of a trench when an average value of a trench angle is brought close to 90 degrees.

Next, trenches 38 are formed in the same manner as in the case of Preliminary Experiment 1. Actually, with respect to part of samples among a group of the samples after forming a trench, cross-sectional observation was carried out by using a scanning electron microscope. As a result, like the case of Preliminary Experiment 1, a trench angle was 80 degrees or more, and the majority of the observed samples had a trench angle of 85 degrees or more. It was attempted to bring the average value of the trench angle close to 90 degrees. As a result, in part of trenches, as schematically illustrated in FIG. 4, the trench side wall face had a curved surface shape. Although the trench angle of a portion where the channel was formed became larger than 90 degrees, the trench angle in the vicinity of the trench bottom part was smaller than 90 degrees.

The surface in the portion 51 having a trench angle larger than 90 degrees of the trench side wall face was in a rough state. This thought to be caused by an accumulation in the portion where the trench angle is larger than 90 degrees because there is no ion impact during plasma etching. Even when a gate oxide film was formed in a sample where such an accumulation was formed, the gate oxide film was broken even at a low gate voltage. Namely, a trench having a trench angle larger than 90 degrees is not practically useful and is undesirable so that an etching condition must be selected such that the trench angle does not exceed 90 degrees.

In this respect, the trench 38 can be formed by the following method in place of the foregoing trench formation method. According to this method, a SiO$_2$ film is formed to a thickness of, for example, 3.5 μm by a plasma CVD method using TEOS as source gas, and an SiO$_2$ mask for plasma etching is formed in the same manner as in the case of an SiO$_2$ mask for ion implantation. Then, anisotropic etching is carried out using parallel plate plasma enhanced CVD system by plasma etching using CF$_4$ and O$_2$ as reacting gases, thereby forming the trench 38.

In this etching, for example, by controlling the flow amount ratio of CF$_4$ and O$_2$, the ratio of etching rate of SiC and a side etching rate of SiO$_2$ can be controlled so that the trench angle can be changed. In other words, the trench angle can be controlled by controlling the flow ratio of CF$_4$ and O$_2$. In the plasma etching used for preparing the device of Embodiment 1, when the flow ratio of CF$_4$ and O$_2$ was generally 1/1, the trench angle became closest to 90 degrees, and when the flow amount of O$_2$ was larger or smaller than that value, the trench angle became small. However, since it is assumed that when the flow amount of O$_2$ is smaller than that of CF$_4$, micromasking is generated due to polymerization of CF$_4$. It is preferable for the flow amount of O$_2$ to be larger than the flow amount needed for the trench angle to become closet to 90 degrees. However, when the flow amount of O$_2$ is excessively large as compared with the flow amount of CF$_4$, it is not practically useful because scattering in the side etching rate of SiO$_2$ becomes large. In view of the practical use, a limit of the flow amount ratio of CF$_4$ and O$_2$ can be applied approximately ⅙.

Furthermore, since the trench angle also changes due to non-uniformity of plasma within the face, cross-sectional observation was carried out by using a scanning electron microscope, thereby measuring the trench angle one by one.

As a result, the obtained trench angle was in the range from 45 to 85 degrees. Where the in-plane distribution was small, it was even approximately 5 degrees in terms of a standard deviation.

Incidentally, the trench formation step is not limited to the foregoing steps. Also, the material of the mask for plasma etching is not limited to Al or $SiO_2$ but can be, for example, Ni. Also, the source gas in accumulating $SiO_2$ is not limited to TEOS but can be, for example, mixed gas of $SiH_4$ and $N_2O$ or a mixed gas of $SiH_4$ and $O_2$. Also, the accumulation method of $SiO_2$ is not limited to the plasma CVD method but can be, for example, a thermal CVD method. Also, the plasma generation system for plasma etching is not limited to the system by ICP or parallel plates but can be, for example, a combination of a system by ICP and a system of parallel plates or a system by ECR (electron cyclotron resonance).

The reacting gas for plasma etching is not limited to the combination of $SF_6$ and $O_2$ or the combination of $CF_4$ and $O_2$ but can be a combination of gases containing high vapor pressure molecules or elements capable of generating radicals regarding both Si and C. For example, the reacting gas can be a combination of at least one substance selected from the group consisting of $C_nH_xF_yCl_z$, where $n \leq (x+y+z) \leq (2n+2)$, provided that $CF_4$, $CHF_3$, and $CCl_3F$ and so on are included, $SF_6$, $NF_3$, $Cl_2$, and HBr, and at least one substance selected from the group consisting of $O_2$, $N_2O$, and $CO_2$.

With respect to the foregoing trench formation step, although various modifications can be thought, it must be capable of realizing a trench angle within a certain range with control properties to some extent. Where at least $SiO_2$ is a mask, a halogen such as fluorine, chlorine, and bromine, and oxygen are contained in plasma, and a suitable amount of carbon is contained in a reacting gas for plasma etching or $SiO_2$ as the mask (which may be the case where carbon due to the accumulation method is contained, such as the case of using TEOS, or the case of intentionally achieving ion implantation), a trench angle smaller than 90 degrees and falling within a certain range is obtained.

The same is also applicable to a situation where gas formed by etching of SiC, such as CO, and $CO_2$, resides for such reasons that an aspect ratio of the trench is high and that a gas pressure is high. This is because $SiO_2$ is reduced by carbon and subjected to side etching by plasma impact or chemical etching with a halogen. On the other hand, so far as a specific trench angle is obtained due to properties of the plasma itself, such is preferable because of excellent reproducibility.

Subsequent to the formation of the trench, the mask for plasma etching made up of Al or $SiO_2$ is removed. Thereafter, a gate oxide film 39 is formed in the same manner as in the case of Preliminary Experiment 1. Incidentally, even in Embodiment 1, a pre-oxide film in forming the gate oxide film 39 can be formed by using various sources or can be formed by various CVD methods as described in the consideration of Preliminary Experiments 1 and 2. Alternatively, the gate oxide film 39 can be directly formed by thermally oxidizing the exposed face of SiC without forming a pre-oxide film.

Furthermore, the gate oxide film 39 is not limited to those formed from various sources or formed by various methods as described previously. Any oxide film is employable so far as it is a film satisfied with a characteristic that the face azimuth dependency of channel mobility is small in a region having relatively high channel mobility as shown in FIG. 2. Furthermore, the film is not limited to an oxide film but can be an insulation film made up of a silica nitride, etc., or a multilayered film made up of insulation materials of different kinds.

Subsequent to the formation of the gate oxide film 39, for example, polysilicon having a high concentration of phosphorus doped therein is accumulated. Then, the polysilicon outside the trench 38 is removed by etch back to form a gate electrode 40. Subsequently, $SiO_2$ is accumulated on the entire surface of the front face by a thermal CVD method or the like, thereby forming an interlayer insulation film 41.

Next, the front face is covered with a photoresist and dipped in buffered hydrofluoric acid, thereby removing the oxide film on the rear face. Then, the rear face is subjected to film formation with, for example, Ni by sputtering. Subsequently, the photoresist on the front surface is removed, and a mask for forming a source contact hole is formed by a photolithography step. Then, a source contact hole is formed in the interlayer insulation film 41 using buffered hydrofluoric acid.

Subsequently, the front face is subjected to film formation with, for example, Ni by sputtering, followed by patterning of the metal. Thereafter, the rear face and the front surface are simultaneously annealed in, for example, an Ar atmosphere at 1,000° C. for 30 minutes, thereby forming a drain electrode 43 and a source electrode 42.

Next, a mask for forming a gate contact hole is formed by a photolithography step, and a gate contact hole is formed by using buffered hydrofluoric acid. Then, the front face is subjected to film formation with, for example, Al by sputtering, followed by patterning of the metal and annealed in an Ar atmosphere at 450° C. for 5 minutes, followed by taking out a gate to form an electrode.

In the foregoing manufacturing process, steps other than the activation step of phosphorus having been subjected to ion implantation during the formation of the $n^+$-type source contact regions 36, the formation of the trenches 38 and the step relating to the formation of the gate oxide film 39 are not particular for a Si or SiC device formation. Furthermore, since steps other than the formation step of the trenches 38 and the step related to the formation of the gate oxide film 39 are not relevant for understanding the present invention, detailed explanations thereof are omitted.

Figure 5:
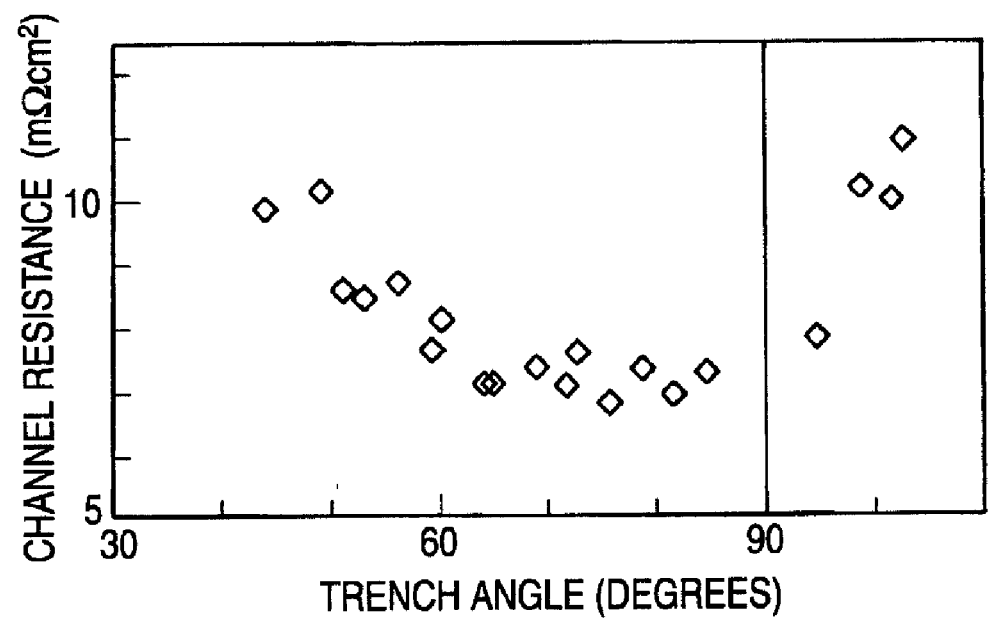
FIG. 5 is a characteristic graph showing the relationship between the channel resistance and the trench angle in a MOSFET of Embodiment 1.

With respect to a plural number of MOSFETs as prepared by the foregoing process, the result obtained by examining the channel mobility is shown in FIG. 5. In FIG. 5, the abscissa represents the trench angle, and the ordinate represents the channel mobility. On the abscissa, the trench angle in the range smaller than 90 degrees is the trench angle of a device prepared on a $(000-1)_c$ face.

On the other hand, the trench angle in the range larger than 90 degrees is a value obtainable by subtracting the trench angle of a device prepared on a $(0001)_{si}$ face from 180 degrees. Also, the channel resistance of MOSFET was determined by preparing TEG (test element group) for evaluation together with MOSFET within the same wafer, determining a resistance component other than the channel by this TEG and subtracting it from the on-resistance of MOSFET.

As is clear from FIG. 5, when the trench angle is larger than 90 degrees, the channel resistance abruptly increases. This is because as noted from Preliminary Experiment 1, when the trench angle is larger than 90 degrees, the change mobility abruptly decreases (see FIG. 2). Accordingly, it is preferable for the trench angle to not exceed 90 degrees.

Furthermore, in the formation step of the trenches 38, as described previously while referring to FIG. 4, when the trench angle exceeds 90 degrees physically rather than in face azimuth, the gate withstand voltage becomes low due to the accumulation on the trench side wall face, and therefore, such is not practically useful. Accordingly, it is suitable for the trench angle to not exceed 90 degrees.

Furthermore, in FIG. 2, the channel mobility is substantially constant in the range of the trench angle of from 50 to 90 degrees, whereas in FIG. 5, when the trench angle becomes 60 degrees or less, the channel resistance largely increases. This is because since the channel resistance is in inverse proportion to the channel mobility and in proportion to the channel length, when the trench angle is small, the channel length increases, and the channel resistance increases.

Specifically, since the channel length is in inverse proportion to a sine of the trench angle, when the trench angle is 65 degrees, the channel length increases by 10% and the channel resistance increases in the same proportion as compared with the case where the trench angle is 90 degrees. When the trench angle is smaller than the foregoing value, both the channel length and the channel resistance abruptly increase. In particular, when the trench angle is smaller than 60 degrees, this increase becomes remarkable, and therefore, not preferable. Accordingly, it is acceptable for the trench angle to be 60 degrees or more. In summary, it is preferable for the trench angle to be in the range of from 60 to 90 degrees.

Now, in Embodiment 1, since the off direction of the substrate is a [11-20] direction, a trench parallel to the off direction is formed, thereby avoiding the influence by the off direction. However, when the off direction of the substrate is other direction, for example, a [1-100] direction, the influence by the off direction cannot be avoided. As the most extreme instance, it is supposed that the off direction of the substrate is a [1-100] direction and that the off angle is a. When a trench is perpendicular to the off direction, when the trench angle is θ, the face azimuth of the trench side wall face in the upstream side is off shifted by (θ+α) from the (1-100) face. On the other hand, the face azimuth of the trench side wall face in the downstream side is off shifted by (θ−α) from a (−1100) face.

When either (θ+α) or (θ−α) is larger than 90 degrees or smaller than 40 degrees, the channel mobility on the trench side wall face abruptly decreases, and therefore, such is not preferable. Accordingly, it is preferable for the upper limit of the trench angle to be not larger than [(90 degrees)−α]. Since the conventional off angle α is 8 degrees, it is preferable for the trench angle to be not larger than 82 degrees. In the future, if the off angle α becomes, for example, 4 degrees, it will be possible to set the upper limit of the trench angle at not larger than 86 degrees.

On the other hand, as described previously, it is preferable from the standpoint of the channel length for the trench angle θ to be 60 degrees or more, and when (θ±α) is 40 degrees or more, the channel mobility does not substantially change. The off angle α is conventionally 8 degrees and will likely become smaller, e.g., not more than 4 degrees, in the future. Accordingly, a lower limit of the trench angle can remain 60 degrees as it is. If anything should happen, where the off angle α is larger than 20 degrees, it is preferable for the trench angle to be [(40 degrees)+α] or more.

In expanding the foregoing to a general case, when the angle formed by the trench direction and the off direction is β, [$\tan^{-1}$ (sin β×tan α)] is used in place of α. This expression represents an effective incline when the off angle is geometrically projected in the direction perpendicular to the trench. When the trench direction coincides with the off direction, this value is 0. In the light of the above, the upper limit of the trench angle can be "(90 degrees)−[$\tan^{-1}$ (sin β×tan α)]", and the lower limit thereof can be either 60 degrees or "(40 degrees)+[$\tan^{-1}$ (sin β×tan α)]," whichever is larger. When the design range of the trench angle at the maximum, the trench direction coincides with the off direction, namely β=0 degree as in Embodiment 1. The off direction of the substrate at a <11-20> direction is preferable because it is possible to achieve such a design.

In putting into practical use, among the prepared plural devices, the number of devices whose trench angle falls within the foregoing range must be a tolerable yield proportion or more. However, it is extremely difficult to obtain the same trench angle within not only the same batch but also the same wafer because of non-uniformity of plasma used for trench etching and other process errors. For that reason, the design must be achieved with reasonable preparation margins.

When the standard deviation of scattering in the trench angle within the face is designated to be σ, a margin of approximately 2σ (approximately 10 degrees in this Embodiment 1) is believed to be effective. That is, the actual upper limit of the trench angle is approximately 2σ smaller than that of the foregoing upper limit, and the actual lower limit is approximately 2σ larger than that of the foregoing lower limit. For example, as described previously, when σ is 5 degrees, a design range of the trench angle is from 70 to 80 degrees.

In Embodiment 1, since the trench etching was carried out by using a plasma etcher not designed for industrial use, σ is large. If σ is decreased to, for example, 2.5 degrees by improving the plasma etcher, the design range of the trench angle will be from 65 to 85 degrees. The average angle of the trench angle corresponds to a designed angle. When the arranged angle of the trench falls within the foregoing range, even when the trench angle is scattered due to processing errors, the channel resistance is not largely scattered.

As a matter of course, since the preparation margin becomes the largest, it is preferable for the designed angle of the trench angle to be an angle in the vicinity of the center of the foregoing design range of the trench angle. When [$\tan^{-1}$ (sin β×tan α)] is smaller than 20 degrees, it is preferable for the designed angle of the trench angle to be 75 degrees regardless of σ. On the other hand, when the trench angle is close to 90 degrees, since the channel length becomes short substantially in the same channel mobility, the channel resistance can be lowered. Accordingly, what trench angle should be designed or what trench angle should be designed therebetween is in a trade-off relation.

Incidentally, in Embodiment 1, since the insulation film just beneath the gate was not protected, the gate was broken prior to the drain breakage, and the withstand voltage was not more than approximately 200 V. In the future, as proposed later, it is thought that by forming a thick insulation film beneath the gate or forming a trench to a depth such that it reaches a field stopping layer and embedding a region lower than the gate polysilicon with $SiO_2$ or other insulation film or a film with low insulation constant, the gate withstand voltage is improved. In this way, since the electrostatic capacitance between the gate and the drain also decreases at the same time, such is preferable in view of the practical use.

According to Embodiment 1, the face azimuth in which a relatively high channel mobility is obtained is used as the trench side wall face, and when the face azimuth deviates due to processing errors, a range in which the channel mobility and the channel resistance do not largely fluctuate is wide. Accordingly, it is possible to prevent the generation of large scattering in the channel resistance without largely increasing the average value of the channel resistance.

Embodiment 2 is an example of the trench MOSFET of Embodiment 1 with the cell pitch made small as far as possible. Here, two specific examples having different trench angle and cell pitch are described. In the first example, a designed trench angle is 75 degrees, and a cell pitch is 16 μm. In the second example, a designed trench angle is 60 degrees, and a cell pitch is 18 μm. When the trench angle is 75degrees or 60 degrees, the cell pitch is defined by rounding up to a designated unit, a value obtained by adding a two-time value of the product of a reciprocal of a tangent of the trench angle and a trench depth to a cell pitch when a designed trench angle is 90 degrees. When the designed trench angle is 90 degrees, the cell pitch is, for example, 14 μm. Also, the trench depth is, for example, 3 μm. The designed unit is, for example, 2 μm. The reason why adding a two-time value of the product of a reciprocal of a tangent of the trench angle and a trench depth resides in that the inclined side wall face is present at both sides of the trench. Since preparation procedures of Embodiment 2 are the same as in Embodiment 1, duplicated descriptions thereof are omitted.

Figure 6:
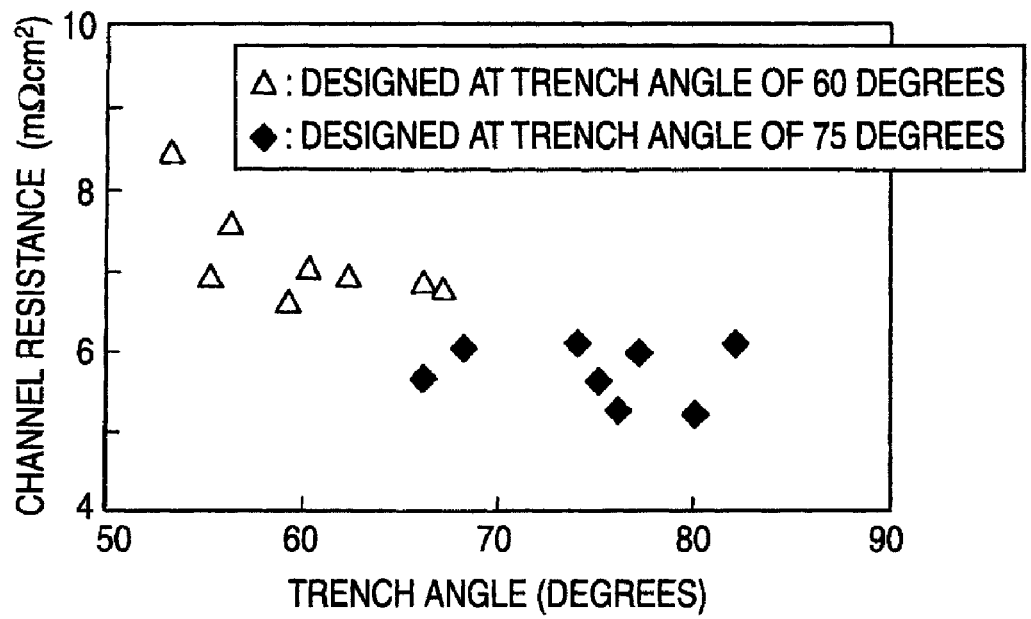
FIG. 6 is a characteristic graph showing the relationship between the channel resistance and the trench angle in a MOSFET of Embodiment 2.

With respect to MOSFETs of the foregoing first example and second example, the result obtained by examining the channel mobility is shown in FIG. 6. As is clear from FIG. 6, data exists in the vicinity of 67 to 68 degrees of the trench angle in both the first example and second example due to in-plane scattering in the trench angle (with the standard deviation of approximately 5 degrees). With respect to these data, the channel resistance of the first example (with the cell pitch of 16 μm and designed trench angle of 75degrees) is approximately 10% smaller than that of the second example (with the cell pitch of 18 μm and designed trench angle of 60 degrees). This is because the channel density per unit area is believed to be in inverse proportion to the cell pitch.

In Embodiment 2, since a mask alignment margin and an exposure boundary are 2 μm, respectively, when the designed trench angle is 90 degrees, the cell pitch is large as 14 μm. For that reason, the influence due to the trench side wall face being inclined is not so large. However, when the mask alignment margin and the exposure boundary are small, the cell pitch is small when the designed trench angle is 90 degrees. Thus, the influence due to the trench side wall face being inclined becomes strong. For example, even by technologies of the related art, it is easy to regulate a mask alignment margin and an exposure boundary at 1 μm, respectively. In that case, when the designed trench angle is 90 degrees, the cell pitch is 7 μm. When the designed trench angle is 75degrees or 60 degrees, the cell pitch is 9 μm or 11 μm, respectively. In the case of a designed trench angle of 75degrees and the case of a designed trench angle of 60 degrees, when they both have the same resulting trench angle due to processing errors, it is predicted that the design at a trench angle of 75 degrees has a smaller channel resistance, smaller by 20% or more, as compared with the design at a trench angle of 60 degrees.

In expanding the foregoing to a general case, if the mask alignment margin and the exposure boundary are designated to be $\lambda$, in a process assumed by the present inventors (process as explained in Embodiment 1), when the designed trench angle is 90 degrees, the cell pitch is $7\lambda$. Incidentally, when the designed trench angle is 90 degrees, the cell pitch can be other than $7\lambda$. In that case, the term "$7\lambda$" as referred to in the following explanation may be given a different reading of a proper value.

When the trench depth is designated to be d and the trench angle is designated to be $\theta$, the cell pitch is $(7\lambda+2d\cdot\cot\theta)$. When the trench angle $\theta$ is 63.4 degrees, a value of $(2\cot\theta)$ is 1. Namely, at this time, the trench depth d is added to the cell pitch $7\lambda$ when the designed trench angle is 90 degrees. When the trench angle $\theta$ is smaller than 63.4 degrees, the cell pitch abruptly increases. Accordingly, 63.4 degrees can be set as a lower limit of the trench angle $\theta$. On the other hand, since the channel resistance increases in proportion to the cell pitch, an approximately two-time value of the cell pitch where the trench angle is 90 degrees is believed to be a limit as a practically useful designed value of the cell pitch. In that case, the trench angle $\theta$ is $[\cot^{-1}(7\lambda/2d)]$, which can be another lower limit of the trench angle $\theta$. When $\lambda$ decreases, the lower limit of the trench angle as given by $[\cot^{-1}(7\lambda/2d)]$ increases.

For example, where $\lambda$ is 2 μm and d is 3 μm, the lower limit of the trench angle as given by $[\cot^{-1}(7\lambda/2d)]$ is about 23 degrees. Accordingly, in this case, since this value is smaller than 60 degrees, which is the lower limit value of the trench angle as determined from the channel length as described in Embodiment 1, the lower limit value of the trench angle can be 60 degrees. However, for example, where $\lambda$ is 0.5 μm, the lower limit of the trench angle as given by $[\cot^{-1}(7\lambda/2d)]$ is about 60 degrees. Accordingly, where $\lambda$ is generally smaller than 0.5 μm, the influence that the cell pitch increases by forming a trench whose side wall face is inclined cannot be neglected. A design index of the trench angle except for this influence is the same as in Embodiment 1.

Incidentally, as described previously, when the lower limit of the trench angle is raised due to the influence of the cell pitch, the lower limit of the design range of the trench angle as defined on the basis of the off angle and the preparation margin in Embodiment 1 also is raised in the same proportion. For example, when $\lambda$ is 0.35 μm, the lower limit of the trench angle as given by $[\cot^{-1}(7\lambda/2d)]$ is about 67 degrees, a value of which is about 7 degrees higher than the lower limit of 60 degrees. Accordingly, when the configuration and manufacturing process other than $\lambda$ being 0.35 μm are identical with those in Embodiment 1, the design range of the trench angle in this example is from 77 to 80 degrees, whereas in Embodiment 1, the design range of the trench angle is from 70 to 80 degrees. According to Embodiment 2, the same effects as in Embodiment 1 are obtained. Furthermore, the preparation margin is larger as compared with that of Embodiment 3.

Embodiment 3 is an example having a cross-sectional structure the same as in the trench MOSFET as illustrated in FIG. 3 and having a hexagonal cell structure in which all lines of intersection between the semiconductor upper face and the trench side wall face are parallel to <11-20> directions. Each trench side wall face is inclined from a {1-100} face into the <0001> direction. In this way, as considered in Preliminary Experiments 1 and 2, even when the trench angle changes within a certain range, it is possible to realize a state where the channel mobility does not largely change.

In Embodiment 3, a third example in which a designed trench angle is 75 degrees and a cell pitch is 16 μm and a fourth example in which a designed trench angle is 60 degrees and a cell pitch is 18 μm will be described. Incidentally, although in Embodiment 3, the hexagon of the cell structure is generally a regular hexagon, it need not be a regular hexagon. Since preparation procedures of Embodiment 3 are the same as in Embodiment 1, duplicated descriptions thereof are omitted.

Figure 7:
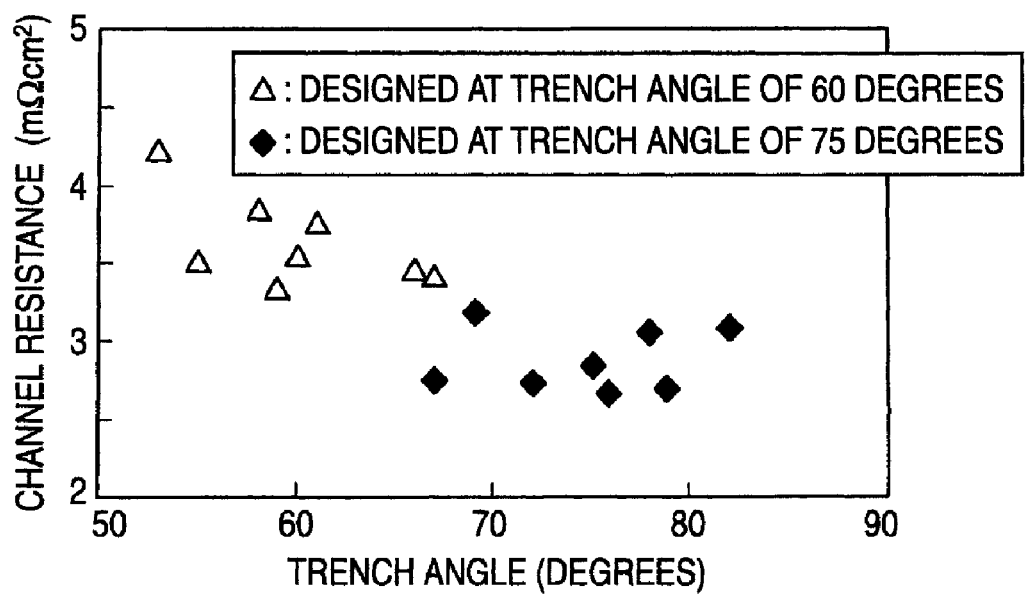
FIG. 7 is a characteristic graph showing the relationship between the channel resistance and the trench angle in a MOSFET of Embodiment 3.

With respect to MOSFETs of the foregoing third example and fourth example, the result obtained by examining the channel mobility is shown in FIG. 7. It is understood from the comparison of FIG. 7 with FIG. 6 that the channel resistance of Embodiment 3 is lower than that of Embodiment 2. This is because the channel density per unit area of Embodiment 3 employing the hexagonal cell structure is higher than that of Embodiment 2 employing the stripe cell structure. It may be said from this matter that the use of a hexagonal cell structure is preferable as compared with the use of a stripe cell structure because the former is able to reduce the channel resistance.

Furthermore, as is clear from FIG. 7, data are in the vicinity of 67 to 68 degrees of the trench angle in both the third example and fourth example due to in-plane scattering in the trench angle (with the standard deviation of approximately 5 degrees). With respect to these data, the channel resistance of the third example (with the cell pitch of 16 μm and designed trench angle of 75 degrees) is approximately 10% smaller than that of the fourth example (with the cell pitch of 18 μm and designed trench angle of 60 degrees). It is thought that this is because like Embodiment 2, in the case of a hexagonal cell structure, the channel density per unit area is in inverse proportion to the cell pitch so that the cell pitch brings an influence.

Here, in Embodiment 3, the face azimuth of each trench side wall face is shifted due to an influence of the off angle. Two opposing faces in parallel to a [11-20] off direction have a shift amount of 0. Where the off angle of the substrate is 8 degrees, two faces positioned in the upstream side in an off angle are shifted by about +7 degrees, and two faces positioned in the downstream side are shifted by about −7 degrees. An absolute value of "7 degrees" as the shift angle is caused by an expression: $\tan^{-1}(0.87 \times \tan 8°)$. When the off angle is designated to be α and an angle formed by the off direction and a <1-100> direction, which is the closest thereto, is designated to be γ, the absolute value of the shift angle is in general given by [$\tan^{-1}(\cos \gamma \times \tan \alpha)$] likewise the consideration in Embodiment 1.

Like the consideration in Embodiment 1, even when the shift is present due to the off angle, the face azimuths as the entire trench side wall faces fall within the range of from 0 to 50 degrees from {1-100} faces into the <0001> direction and that the channel length does not markedly increase, the upper limit of the trench angle is "(90 degrees)−[$\tan^{-1}(\cos \gamma \times \tan \alpha)$]", and the lower limit thereof is either 60 degrees or "(50 degrees)+[$\tan^{-1}(\cos \gamma \times \tan \alpha)$]," whichever is larger. When the off direction is a <11-20> direction, "cos γ" becomes the smallest and is about 0.87.

In Embodiment 3, since the preparation margin increases, it is preferable to use a substrate whose off direction is a <11-20> direction. Where the substrate has an off direction of a <11-20> direction and an off angle of 8 degrees, in view of the expression or the relation giving the foregoing upper limit and lower limit of the trench angle, the trench angle is preferably in the range of from 60 to 83 degrees. In the future, where the off angle is lowered to 4 degrees, it is preferable for the trench angle to fall within the range of from 60 to 86 degrees.

In putting into practical use, like Embodiment 1, it is necessary to achieve a design with reasonable preparation margins of two times the standard deviation σ of scattering in the trench angle within the face, namely approximately 2σ. Accordingly, the actual upper limit of the trench angle is approximately 2σ smaller than the foregoing upper limit, and the actual lower limit is approximately 2σ larger than the foregoing lower limit. For example, when forming a hexagonal cell structure using a substrate having an off angle of 8 degrees under a condition that σ is 5 degrees, the design range of the trench angle is from 70 to 73 degrees. In the future, when the off angle α becomes 4 degrees, the design range of the trench angle will become from 70 to 76 degrees.

As described in Embodiment 1, for example, when σ is 2.5 degrees, the design range of the trench angle can be from 65 to 78 degrees where the off angle of the substrate is 8 degrees, and from 65 to 81 degrees where the off angle of the substrate is 4 degrees. Where the average angle (designed angle) of the trench angle falls with the foregoing range, even when the trench angle becomes scattered due to processing errors, the channel resistance is not largely scattered.

For providing the largest preparation margin, it is preferable for the designed angle of the trench angle to be an angle in the vicinity of the center of the foregoing design range of the trench angle. On the other hand, for reducing the channel resistance, it is preferable for the designed angle to be an angle close to 90 degrees. Such a relation is in a trade-off relation, which is the same in Embodiment 1. According to Embodiment 3, the same effects as in Embodiment 1 are obtained. In particular, Embodiment 3 has a smaller channel resistance as compared with Embodiments 1 and 2.

Even when the trench angle fluctuates due to processing errors at the time of manufacture or the face azimuth of the trench side wall face slightly changes into the <0001> direction due to the off angle, the channel mobility does not largely change. By employing such a device structure, it is possible to suppress scattering in the channel resistance in a low channel resistance region. Where the trench side wall face is inclined from a {1-100} face family of 4H-SiC into a <0001> direction, the face azimuth dependency of the channel mobility is smaller as compared with the case where the trench side wall face is inclined from a {11-20} face family thereof into a <0001> direction. Accordingly, even when an angle formed by the trench side wall face and the major face of the SiC semiconductor layer changes, it is possible to realize the situation that the channel mobility does not largely change.

Since the off direction of the major face of the SiC semiconductor layer is separated from the family of the <1-100> direction, a tolerable range of the angle formed by the trench side wall face and the major face of the SiC semiconductor layer is widened. However, in the case of a hexagonal cell structure, since the same family azimuth comes round at every 60 degrees within the {0001} face, attention should be taken such that the angle be at most 30 degrees.

In the light of the above, the semiconductor device and manufacturing method thereof according to the invention are useful for semiconductor devices such as SiC vertical trench MOSFETs, and especially suitable for semiconductor devices to be used as a high withstand voltage power device.

The present invention is not limited to the foregoing embodiments but can be modified in various ways. For example, the angles, dimensions, and concentrations as described in the embodiments are merely exemplary, and should not be construed that the invention is limited to those values. Furthermore, in each of the foregoing embodiments, even by exchanging the p and n conductive types, the same is applicable.

While the present invention has been particularly shown and described with reference to preferred embodiments thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2005-264278, filed on 12 Sep. 2005. The disclosure of the priority application, in its entirety, including the drawings, claims, and the specification thereof, is incorporated herein by reference.

What is claimed is:

1. A semiconductor device comprising:
   at least one SiC semiconductor layer having an azimuth of a major face thereof that is generally a {0001} face and having an off angle α in a range of 4-8°; and at least one trench in the semiconductor layer having side walls, with normal lines of faces of the side walls extending generally in a <1-100> direction when projected on the major face of the semiconductor layer, wherein an angle formed by the side wall faces of the trench and the major face of the semiconductor layer is 60 degrees or more but not more than [(90 degrees)–$\tan^{-1}$ (0.87×tan α)].

2. The semiconductor device according to claim 1, wherein a plurality of unit structures each including the trench is formed at a predetermined pitch, which is not more than two times a pitch of the unit structure where the side wall faces of the trench would form an angle of 90 degrees against the major face of the SiC semiconductor layer.

3. The semiconductor device according to claim 2, wherein the azimuths of the trench side wall faces are off from any of the {1-100} face family of SiC into the <0001> direction.

4. The semiconductor device according to claim 3, wherein an off direction of the major face of the SiC semiconductor layer is generally in a <11-20> direction.

5. The semiconductor device according to claim 2, wherein an off direction of the major face of the SiC semiconductor layer is generally in a <11-20> direction.

6. The semiconductor device according to claim 1, wherein the azimuths of the trench side wall faces are off from any of the {1-100} face family of SiC into the <0001> direction.

7. The semiconductor device according to claim 6, wherein an off direction of the major face of the SiC semiconductor layer is generally in a <11-20> direction.

8. The semiconductor device according to claim 1, wherein an off direction of the major face of the SiC semiconductor layer is generally in a <11-20> direction.

9. The semiconductor device according to claim 1, wherein the side wall faces of the trench are not parallel to an off direction of the major face of the SiC semiconductor layer.

10. A method of manufacturing a semiconductor device comprising the steps of:
providing at least one SiC semiconductor layer having an azimuth of a major face thereof that is generally a {0001} face and having an off angle α in a range of 4-8°; and
forming at least one trench in the semiconductor having side walls, with normal lines of faces of the side walls extending generally in a <1-100> direction when projected on the major face of the semiconductor layer, with an angle formed by the side wall faces of the trench and the major face of the semiconductor layer being 60 degrees or more but not more than [(90 degrees)–$\tan^{-1}$ (0.87×tan α)].

11. The method according to claim 10, wherein the trench forming step includes setting a design value of the angle formed by the trench side wall faces and the major face of the semiconductor layer at any angle within the range from (60 degrees+2σ) to [(90 degrees)–$\tan^{-1}$ (0.87×tan α)–2σ], where σ represents a standard deviation of scattering in the angle formed by the trench side wall faces and the major face of an SiC semiconductor layer within a wafer face of a wafer forming the semiconductor layer.

12. The method according to claim 11, further including the steps of:
accumulating polysilicon on the trench side wall faces; and
thermally oxidizing the polysilicon to form a gate oxide film.

13. The method according to claim 10, wherein a plurality of unit structure including the trench is formed at a predetermined pitch, which is not more than two times a pitch of the unit structure where the side wall faces of the trench would form an angle of 90 degrees against the major face of the SiC semiconductor layer.

14. The method according to claim 13, wherein the azimuths of the trench side wall faces are off from any of the {1-100} face family of SiC into the <0001> direction.

15. The method according to claim 14, wherein an off direction of the major face of the SiC semiconductor layer is generally in a <11-20> direction.

16. The method according to claim 13, wherein an off direction of the major face of the SiC semiconductor layer is generally in a <11-20> direction.

17. The method according to claim 10, wherein the azimuths of the trench side wall faces are off from any of the {1-100} face family of SiC into the <0001> direction.

18. The method according to claim 17, wherein an off direction of the major face of the SiC semiconductor layer is generally in a <11-20> direction.

19. The method according to claim 10, wherein an off direction of the major face of the SiC semiconductor layer is generally in a <11-20> direction.

20. The method according to claim 10, wherein the side wall faces of the trench are not parallel to an off direction of the major face of the SiC semiconductor layer.

* * * * *